(12) United States Patent
Wang (10) Patent No.: US 9,482,920 B2
(45) Date of Patent: Nov. 1, 2016

(54) TRANSPARENT RESISTIVE RANDOM ACCESS MEMORY CELLS (71) Applicant: Intermolecular, Inc., San Jose, CA (US)

(72) Inventor: Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 16 days.

(21) Appl. No.: 14/504,980

(22) Filed: Oct. 2, 2014

(65) Prior Publication Data

US 2016/0097945 A1  Apr. 7, 2016

(51) Int. Cl.
*G02F 1/1365* (2006.01)
*H01L 45/00* (2006.01)

(52) U.S. Cl.
CPC ............ *G02F 1/1365* (2013.01); *H01L 45/08* (2013.01); *H01L 45/1233* (2013.01); *H01L 45/1253* (2013.01); *H01L 45/145* (2013.01); *H01L 45/146* (2013.01); *G02F 2203/01* (2013.01)

(58) Field of Classification Search
CPC . H01L 27/2436; H01L 45/146; H01L 45/08; H01L 45/1233; H01L 45/145; H01L 45/1253; G02F 1/1365; G02F 1/13439
See application file for complete search history.

(56) References Cited

U.S. PATENT DOCUMENTS

| | | | |
|---|---|---|---|
| 2009/0194760 A1* | 8/2009 | Gosain et al. | G02F 1/1362 257/4 |
| 2012/0132882 A1* | 5/2012 | Seo et al. | 257/4 |
| 2013/0026438 A1* | 1/2013 | Wang et al. | 257/4 |
| 2013/0078761 A1* | 3/2013 | Sun et al. | 438/104 |
| 2015/0129826 A1* | 5/2015 | Wang | 257/4 |
| 2015/0155334 A1* | 6/2015 | Lu et al. | H01L 45/1226 |

OTHER PUBLICATIONS

Coutts et al.; Transparent Conducting Oxides: Status and Opportunities in Basic Research; Aug. 1999; National Renewable Energy Laboratory; 17 pages.

* cited by examiner

*Primary Examiner* — Fazli Erdem (57) ABSTRACT

Provided are resistive switching cells and methods of using such cells for controlling operation of liquid crystal display (LCD) cells in LCD devices. A resistive switching cell has two electrodes formed from transparent conductive oxides, such as indium oxide, indium tin oxide, or zinc oxide. One electrode may be connected to a LCD cell thereby forming an in series connection between the resistive switching cell and LCD cell. The other electrode may be used to power the LCD cell through the resistive switching cell. The resistive switching cell also includes a resistive switching layer disposed between the two electrodes. When the resistive switching layer is in its low resistive state, the LCD cell is subjected to an operating potential and produces light. However, when the resistive switching layer is in its high resistive state, the LCD cell is not subjected to the operating potential and does not produce light.

20 Claims, 8 Drawing Sheets

TRANSPARENT RESISTIVE RANDOM ACCESS MEMORY CELLS

BACKGROUND

Operation of liquid crystal display (LCD) cells is typically controlled by transistors or, more specifically, thin film transistors. Specifically, a source region or a drain region of a transistor is connected to one electrode of an LCD cell. The gate voltage of the transistor is controlled to either allow the electrical current to pass through the transistor and, as a result, through the LCD cell or block the electrical current. However, transistors are bulky structures that are difficult to fabricate and that occupy significant portions of display surfaces. These portions cannot be used to emit light from LCD cells and may be referred to as dark portions in order to distinguish these portions from light portions that emit light. Furthermore, the source and drain regions of the transistor typically require electrodes made from non-transparent materials. The footprint of such electrodes adds to the size of the dark portion. In some embodiments, the size of the dark portion represents about 10%-30% of the total display area. The overall size of a dark portion in a typical LCD device needs to be minimized while retaining control over operation of the LCD cells. The reduction in the size of the dark portion improves brightness and other characteristics of the LCD device. Ideally, the entire surface of an LCD device is a light portion. Furthermore, use of large transistors (e.g., about 3 micrometers by 10 micrometers) prevent large pixel density even though the size of each pixel can be reduced. Larger large pixel densities are highly desirable in particular for small displays. At the same time, the size of transistors has already reaches its practical limit. Finally, transistors are generally not flexible devices, which may limit the overall flexibility of the display. Yet, there are strong drivers to develop flexible displays.

SUMMARY

Provided are resistive switching cells and methods of using such cells for controlling operation of LCD cells in LCD devices. A resistive switching cell has two electrodes formed from transparent conductive oxides, such as indium oxide, indium tin oxide, or zinc oxide. One electrode may be connected to a LCD cell thereby forming an in series connection between the resistive switching cell and LCD cell. The other electrode may be used to power the LCD cell through the resistive switching cell. The resistive switching cell also includes a resistive switching layer disposed between the two electrodes. When the resistive switching layer is in its low resistive state, the LCD cell is subjected to an operating potential and produces light. However, when the resistive switching layer is in its high resistive state, the LCD cell is not subjected to the operating potential and does not produce light. As such, the resistive state of the resistive switching layer in the resistive switching cell is used to control operation of the LCD cell.

Provided is a resistive switching cell that includes a first layer disposed over a substrate, a second layer disposed over the first layer such that the first layer is disposed between the second layer and the substrate, and a third layer disposed over the second layer such that the second layer is disposed between the first layer and the third layer. The first layer and the third layer are operable as electrodes. The first layer comprises a first transparent conductive oxide. The third layer comprises a second transparent conductive oxide. The second layer is operable to switch between at least two different resistive states and may be referred to as a resistive switching layer. The second layer has a thickness of less than 100 Angstroms. At this thickness, the second layer may be substantially transparent even if it formed from oxides and/or oxynitride that are not conventionally considered to be transparent. In some embodiments, the second layer has a thickness of less than 30 Angstroms, which further enhances transparency of the second layer.

In some embodiments, the optical transmittance of the resistive switching cell is at least about 80% or, more specifically, at least about 90% and even at least 95% within the visible wavelength spectrum. Such values of the optical transmittance allow positioning the resistive switching cell above a light emitting portion of an LCD cell. This portion may be also referred to as a light portion of the LCD cell to distinguish it from a dark portion of the LCD device that does not produce any light or where the light is blocked by a non-transparent object, such as an electrode. In some embodiments, the substrate includes an LCD cell connected in series with the resistive switching cell. The resistive switching cell may be disposed over an illuminating surface of the LCD cell.

The second layer includes one of hafnium oxide, hafnium oxynitride, zirconium oxide, zirconium oxynitride, aluminum oxide, aluminum oxynitride, titanium oxide, titanium oxynitride, tantalum oxide, or tantalum oxynitride. For example, the second layer includes hafnium oxide or, more specifically, non-stoichiometric hafnium oxide. In some embodiments, the second layer also includes silicon oxide. This silicon oxide forms a first sub-layer of the second layer, while the hafnium oxide forms a second sub-layer of the second layer directly interfacing the first sub-layer.

In some embodiments, at least one of the first transparent conductive oxide and the second transparent conductive oxide includes one of indium oxide, indium tin oxide, or zinc oxide. More specifically, at least one of the first transparent conductive oxide and the second transparent conductive oxide includes zinc oxide doped with aluminum. In some embodiments, both first and second transparent conductive oxides include zinc oxide doped with aluminum.

In some embodiments, the resistive switching cell also includes a fourth layer disposed between the second layer and one of the first layer or third layer. The fourth layer may be operable to maintain a substantially constant resistance when the second layer switches between the at least two different resistive states. As such, the fourth layer may be referred to as an embedded resistor. The fourth layer may have a thickness of less than 50 Angstroms. In some embodiments, the fourth layer includes one of tantalum silicon nitride, titanium silicon nitride, tungsten silicon nitride, or molybdenum silicon nitride. Specifically, the fourth layer may include tantalum silicon nitride.

Provided also is a method of operating an LCD device display. The method involves providing an LCD cell interconnected in series with a resistive switching cell. The resistive switching cell includes a first layer disposed over a substrate, a second layer disposed over the first layer such that the second layer is disposed between the first layer and the substrate, and a third layer disposed over the second layer such that the second layer is disposed between the first layer and the third layer. The first layer and the third layer are operable as electrodes. The third layer is connected to the LCD cell. In some embodiments, the third layer may be connected to a signal line used to monitor and switch the resistive state of the second layer. The first layer may a first transparent conductive oxide, while the third layer may include a second transparent conductive oxide. The second layer is operable to switch between a low resistive state and a high resistive state. The second layer has a thickness of less than 100 Angstroms to ensure its transparency.

The method may proceed with applying a first switching pulse between the first layer and the third layer. The second layer switches into the low resistance state when the first switching pulse is applied. The method may proceed with applying an operating potential to the first layer. The LCD cell produces light while the operating potential is applied to the first layer and while the second layer is in the low resistive state. The method may proceed with applying a second switching pulse between the first layer and the third layer. The second layer switches into the high resistance state while applying the second switching pulse. The method proceeds with applying the operating potential to the first layer. The LCD cell does not produce light while the operating potential is applied to the first layer and while the third layer is in the high resistive state.

In some embodiments, each of applying the first switching pulse, applying the operating potential to the first layer, and applying the second switching pulse is repeated at least once. At least a portion of the light produced by the LCD cell may be transmitted through the resistive switching cell. At least a portion of the resistive switching cell may be disposed over at least a portion of the illuminating surface of the LCD cell. In some embodiments, the entire resistive switching cell is disposed over a portion of the illuminating surface.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

Transparent electronic devices offer potential for innovative products and improvement of exiting products. While some electronic devices, which are used for specific optical applications, have undergone significant development, other types of electronic components have been generally overlooked. One such component is a resistive switching memory cell or, more specifically, a resistive random access memory (ReRAM) cell. Memory cells are typically arranged into bulky high density arrays in order to improve storage capacity for a given volume without any concerns for transparency. These arrays are used to store large amounts of data and may be used in flash drives, memory cards, solids state hard drives, and other like applications. Yet, it has been recently discovered that resistive switching cells may be used for other applications, such as controlling LCD cells in a LCD device display. Currently, thin film transistors (TFTs) are used for these purposes. However, each TFT requires a significant footprint and cannot be formed as a sufficiently transparent device. As such, a large portion of an LCD device display remains inactive, i.e., cannot be used to supply light, as further described below. Thus, a footprint of each TFT and often signal lines extending to each TFT represent a dark portion of the screen, which needs to be minimized.

A resistive switching cell can be operated in a manner similar to that of a TFT by blocking or allowing an electrical current through an LCD cell connected in series with the resistive switching cell. Instead of storing a bit of information, the cell is used as a current controlled device and, therefore, may be referred to as a resistive switching cell. When the resistive switching cell is in its low resistive state, it allows the current to pass through the resistive switching cell and the LCD cell connected in series with the resistive switching cell. This passage of current translates into light produced by the LCD cell. On the other hand, when the resistive switching cell is in its high resistive state, it does not allow the same level of current to pass through the resistive switching cell and the LCD cell connected in series with the resistive switching cell, and the LCD cell does not produce the light. It should be noted that the resistive switching cell does not require a controlled voltage or current to be applied to it in order to maintain either its low resistive state or its high resistive state. As such, the resistive switching cell may be referred to as a two node control device as oppose to a TFT, which is a three node control device.

The resistive switching cell has a generally simpler design that a TFT, which allows constructing the resistive switching cell from new materials, such as transparent materials, and provides simpler integration. In addition to LCD applications, transparent resistive switching cells may be used for windows, lenses of glasses, and other like applications. The resistive switching cell may be used for controlling (e.g., similar to its function in a LCD device display), storing data, and other applications. This may expand application of memory devices and arrays formed from these devices beyond conventional uses of flash memory. The transparent memory cells may be arranged into cross-bar memory architecture as further described below with reference to FIG. 5. Other devices, such as LCD cells, may be integrated into these arrays.

Each resistive switching cell includes a resistive switching layer disposed between two electrodes. In some embodiments, other components, such as embedded resistors and/or current steering elements may be used as well. The electrodes can also serve as signal lines, such as bit lines and/or word lines, and shared by other resistive switching cells and devices arranged in the same array. The materials for the electrodes and resistive switching layer are selected in such a way that the entire stack is sufficiently transparent. For example, a resistive switching cell may have an optical transmittance of at least 80% for the entire range of visible light. In some embodiments, highly conductive (e.g., resistivity of less than 1 mOhm-cm) but, at the same time, sufficiently transparent materials may be used for electrodes in resistive switching cells. The conductivity ensures minimal voltage drop from one resistive switching cell to another despite of the location in the array. Furthermore, the conductivity allows scaling down to smaller dimensions and use narrower electrodes used as signal lines. One group of materials suitable for electrodes includes transparent conductive oxide (TCO), such as indium oxide ($In_2O_3$), indium tin oxide (ITO), and zinc oxide (ZnO). Most of TCOs are wide band-gap semiconductors that have a relatively high concentration of free electrons in its conduction band. Addition of a dopant to a TCO, such as less than 10% atomic of aluminum to zinc oxide, can greatly enhance the electrical conductivity with little, if any, reduction in optical transmittance. A TCO can be deposited using sputtering or chemical vapor deposition (CVD).

A resistive switching layer may be formed from a thin metal oxide layer. The thickness of the layer may be less than 100 Angstroms or even less than 30 Angstroms. Some examples of suitable materials include hafnium oxide, tantalum oxide, titanium oxide, aluminum oxide, zirconium oxide, hafnium nitride, tantalum nitride, titanium nitride, aluminum nitride, zirconium nitride, hafnium oxynitride, tantalum oxynitride, titanium oxynitride, aluminum oxynitride, and zirconium oxynitride. These materials are sufficiently transparent at thicknesses specified above and still capable of resistive switching. A resistive switching layer can be deposited using sputtering, atomic layer deposition (ALD), or chemical vapor deposition (CVD), in particular, plasma enhanced chemical vapor deposition (PECVD).

In some embodiments, a resistive switching cell may include an embedded resistor. The embedded resistor is a layer operable to maintain a substantially constant resistance when the resistive switching layer switches between its different resistive states. The embedded resistor may have a thickness of less than 50 Angstroms. The embedded resistor may be formed from tantalum silicon nitride, titanium silicon nitride, tungsten silicon nitride, or molybdenum silicon nitride. In some embodiments, a transparent oxide having a low dopant concentration or no dopant at all may be used in an embedded resistor. The resistivity of the embedded resistor may be between about 1-100 Ohm-cm, which distinguishes the embedded resistor from other components such as electrodes.

Examples of Resistive Switching Cells and their Switching Mechanisms

A brief description of resistive switching cells is provided for context and better understanding of various features associated with using these cells to control operations of LCD cells and other applications. As stated above, a resistive switching cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1A:
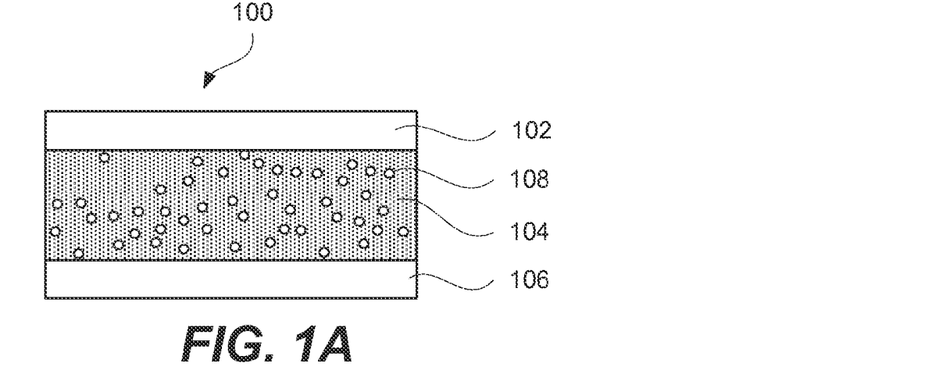
FIG. 1A illustrates a schematic representation of a resistive switching cell prior to initial forming operation, in accordance with some embodiments.

FIG. 1A illustrates a schematic representation of resistive switching cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. Resistive switching cell 100 may also include other components, such as an embedded resistor, diode, diffusion barrier layer, and other components.

First electrode 102 and second electrode 106 may be used as conductive lines within an array or other types of devices that resistive switching cell 100 is integrated into. As such, electrodes 102 and 106 are generally formed from conductive materials. Materials of electrodes 102 and 106 and materials of resistive switching layer 104 are transparent.

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of resistive switching cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
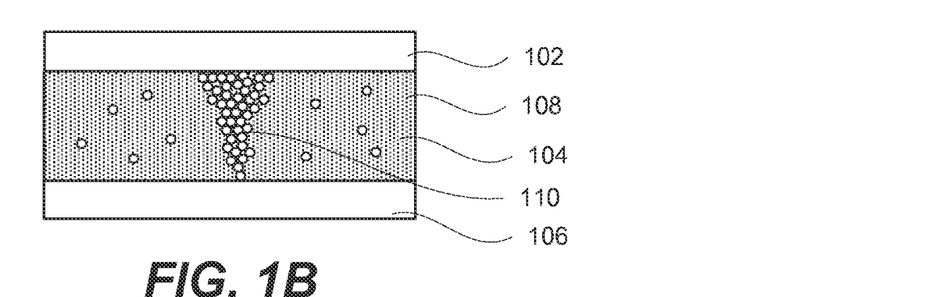
FIGS. 1B and 1C illustrate schematic representations of the resistive switching cell in its low resistive state (LRS) and high resistive state (HRS), in accordance with some embodiments.

During the forming operation, resistive switching cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within resistive switching cell 100. This reorientation of defects 108 occurs when a certain forming voltage is applied to electrodes 102 and 106. In some embodiments, the forming operation also conducted at elevated temperatures to enhanced mobility of the defects within resistive switching cell 100. In general, the forming operation is considered to be a part of the fabrication of resistive switching cell 100, while subsequent resistive switching is considered to be a part of operation of resistive switching cell.

Figure 1C:
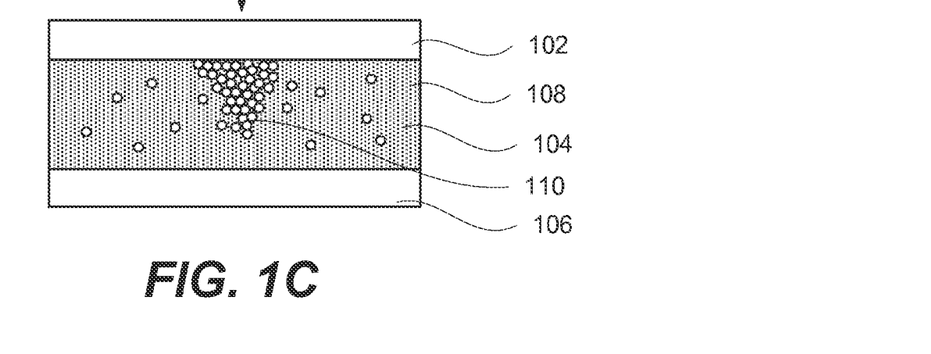

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
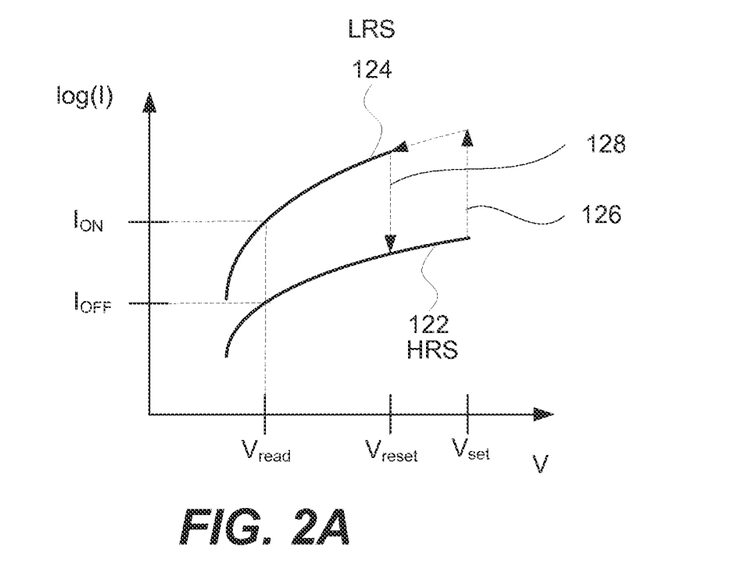
FIG. 2A illustrates a plot of a current passing through a unipolar resistive switching cell as a function of a voltage applied to the resistive switching cell, in accordance with some embodiments.
Figure 2B:
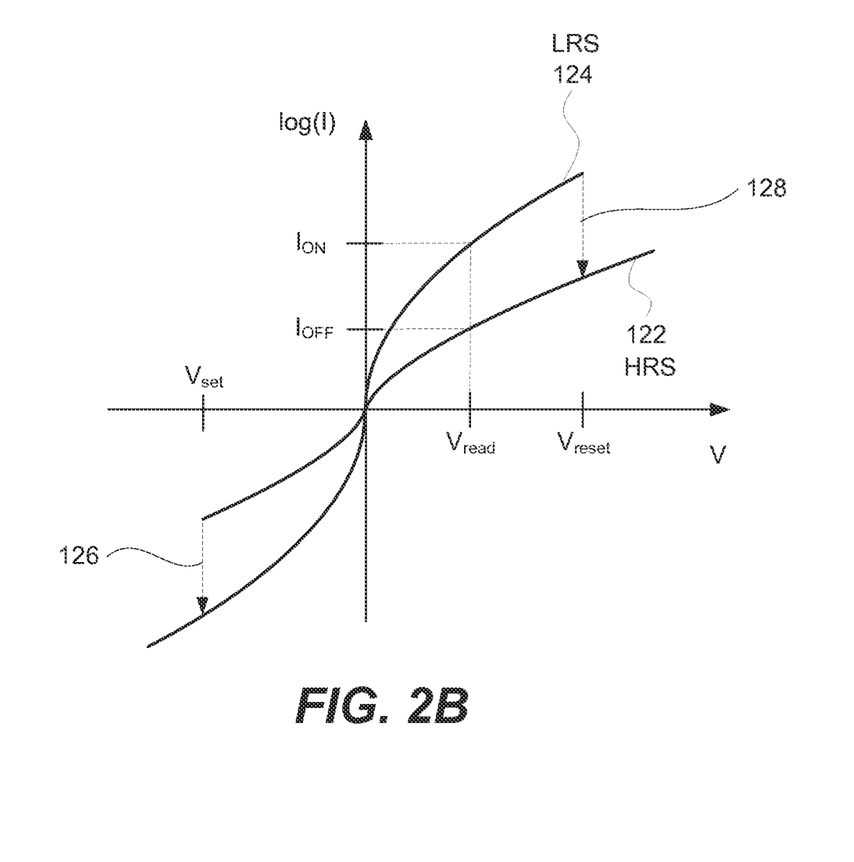
FIG. 2B illustrates a plot of a current passing through a bipolar resistive switching cell as a function of a voltage applied to the resistive switching cell, in accordance with some embodiments.

Specifically, FIG. 2A illustrates a plot of a current passing through a unipolar resistive switching cell as a function of a voltage applied to the resistive switching cell, in accordance with some embodiments. FIG. 2B illustrates the same type of a plot for a bipolar resistive switching cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each resistive switching cell that has two resistance states may be used to store one bit of data. It should be noted that some resistive switching cells may have three and even more resistance states allowing multi-bit storage in the same cell.

The overall operation of the resistive switching cell may be divided into a read operation, set operation (i.e., turning the cell "ON" by changing from its HRS to LRS), and reset operation (i.e., turning the cell "OFF" by changing from its LRS to HRS). During the read operation, the state of the resistive switching cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the resistive switching cell is in its HRS (represented by line 122 in FIGS. 2A and 2B), the external read and write circuitry connected to the electrodes will sense the resulting "OFF" current ($I_{OFF}$) that flows through the resistive switching cell. As stated above, this read operation may be performed multiple times without changing the resistive state (i.e., switching the cell between its HRS and LRS). In the above example, the resistive switching cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the resistive switching cell in its LRS are represented by line 124. When the read voltage ($V_{READ}$) is applied to the electrodes of the cell in this state, the external read and write circuitry will sense the resulting "ON" current ($I_{ON}$) that flows through the resistive switching cell. Again, this read operation may be performed multiple times without switching the state of the resistive switching cell.

At some point, it may be desirable to turn "OFF" the resistive switching cell by changing its state from the LRS to HRS. This operation is referred to as a reset operation and should be distinguished from set operation during which the resistive switching cell is switched from its HRS to LRS. During the reset operation, a reset voltage ($V_{RESET}$) is applied to the resistive switching cell to break the previously formed conductive paths in the resistive switching layer. Switching from a LRS to HRS is indicated by dashed line 128. Detecting the state of the resistive switching cell while it is in its HRS is described above.

Overall, the resistive switching cell may be switched back and forth between its LRS and HRS many times. Read operations may be performed in each of these states (between the switching operations) one or more times or not performed at all. It should be noted that application of set and reset voltages to change resistance states of the resistive switching cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). Resistive switching cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of LCDs Devices and Resistive Switching Cells Used in Such LCD Devices

Figure 3A:
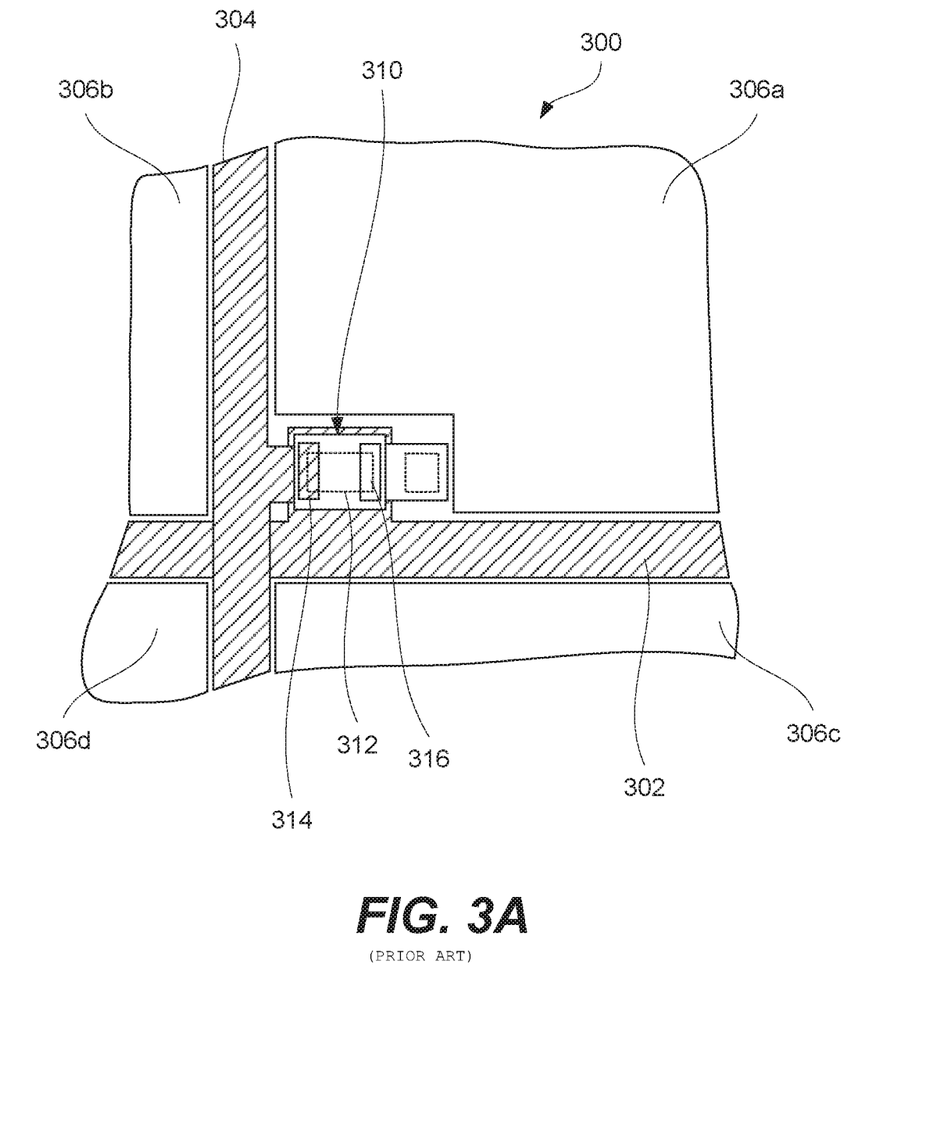
FIG. 3A is a schematic top view of a portion of a conventional LCD device display that uses thin film transistors to control operation of LCD cells, in accordance with some embodiments.

Conventional LCD devices using TFTs for controlling LCD cells and novel LCD devices using resistive switching cells for controlling LCD cells will be now described with reference to FIGS. 3A and 3B. Description of both types of devices is provided to compare and contrast their features and to illustrate various benefits of using resistive switching cells for controlling LCD cells. In general, an LCD device generates an image using a plurality of pixels, each pixel having one or more LCD cells. An LCD device may use optical anisotropy and polarization properties of liquid crystal (LC) molecules. Suitable LC molecules have a definite arrangement orientation that can be controlled by applying an electric field to an LCD cells containing these LC molecules. Specifically, when the electric field is applied to the LC molecules, the direction of the arrangement orientation of the LC molecules changes. Since the incident light is refracted according to the direction of the arrangement orientation, image data may be displayed when this arrangement orientation is changed (and the potential is applied) and not displayed when the arrangement orientation is not changed (and the potential is not applied or a smaller potential is applied that is not capable of changing the orientation). In a LCD device, LC cells may be disposed over a light source such as a light guide.

A conventional LCD device uses thin film transistors (TFTs) as switching elements for controlling the flow of electrical current through its LCD cells. This type of an LCD device may be called a thin film transistor liquid crystal display (TFT-LCD) device. TFTs and LCD cells may be arranged in two dimensional arrays. FIG. 3A is a top schematic view of a portion of conventional TFT-LCD device 300, in accordance with some embodiments. TFT-LCD device 300 includes gate line 302 and data line 304, which may be arranged orthogonally with respect to each other. Gate line 302 and data line 304 may extend to edges of TFT-LCD device 300 and connected to external drive circuitry (not shown). TFT-LCD device 300 also includes LCD cell 306a, which may extend up gate line 302 and data line 304 and up to TFT 310. Even if a portion of LCD cell 306a extends under gate line 302, data line 304, and/or up to TFT 310, the light produced by this portion is blocked by gate line 302, data line 304, and/or up to TFT 310, which are not transparent in conventional TFT-LCD device 300. Portions of three other LCD cells 306b-306d are shown for reference.

TFT 310 may be positioned near crossing of gate line 302 and data line 304. TFT 310 has gate electrode 312 connected to gate line 302, source electrode 314 connected to data line 304, and drain electrode 316 connected to LCD cell 306a. For example, a contact hole may be used to establish the electrical connection between drain electrode 316 and LCD cell 306a.

The external drive circuitry controls LCD cell 306a using gate line 302, data line 304, and TFT 310. Specifically, when gate line 302 receives one type of a gate signal (e.g., a particular voltage is applied to gate line 302), TFT 310 turns on thereby allowing the electrical current to pass between source electrode 314 and drain electrode 316. As such, the signal (e.g., an operating potential) applied to data line 304 is also transferred (in large part) to LCD cell 306a. For example, a potential applied to data line 304 generates an electrical filed in an LCD cell 306a and changes the arrangement direction of LC molecules in LCD cell 306a. As described above, this change in arrangement direction causes the LC molecules to refract the light generated by a back light device, which may be a part of the substrate supporting LCD cell 306a, TFT 310, gate line 302, and data line 304. When gate line 302 receives another type of the gate signal (e.g., no voltage or a different voltage applied to gate line), TFT 310 turns off and does not allow the electrical current to pass between source electrode 314 and drain electrode 316. In this case, the arrangement direction of the LC molecules is not changed and, thus, the direction of the light from back light device is not changed.

When fabricating LCD device 300, a number of complicated process steps are required. For example, forming TFT 310 requires numerous masking processes, each having a corresponding photolithography process, which makes the process of fabricating LCD device 300 slow and expensive. Furthermore, specific materials are needed to ensure robust performance of various components of LCD device 300, in particular TFT 310. Additionally, the resistivity of materials used for gate line 302 and data line 304 impacts the picture quality of large LCD device 300 (e.g., over 12 inches) and of LCD device 300 having high resolution. Materials used for gate line 302 and data line 304 also need to be compatible with source electrode 3014 and gate electrode 312 of TFT 310. As a result, aluminum or aluminum-alloys are often used for gate line 302 and data line 304. However, aluminum or aluminum-alloys are not transparent (and often used as reflective media in, e.g., low-E glass applications). Furthermore, TFT 310 is also not transparent. Overall, conventional LCD device 300 has substantial areas that block light.

Figure 3B:
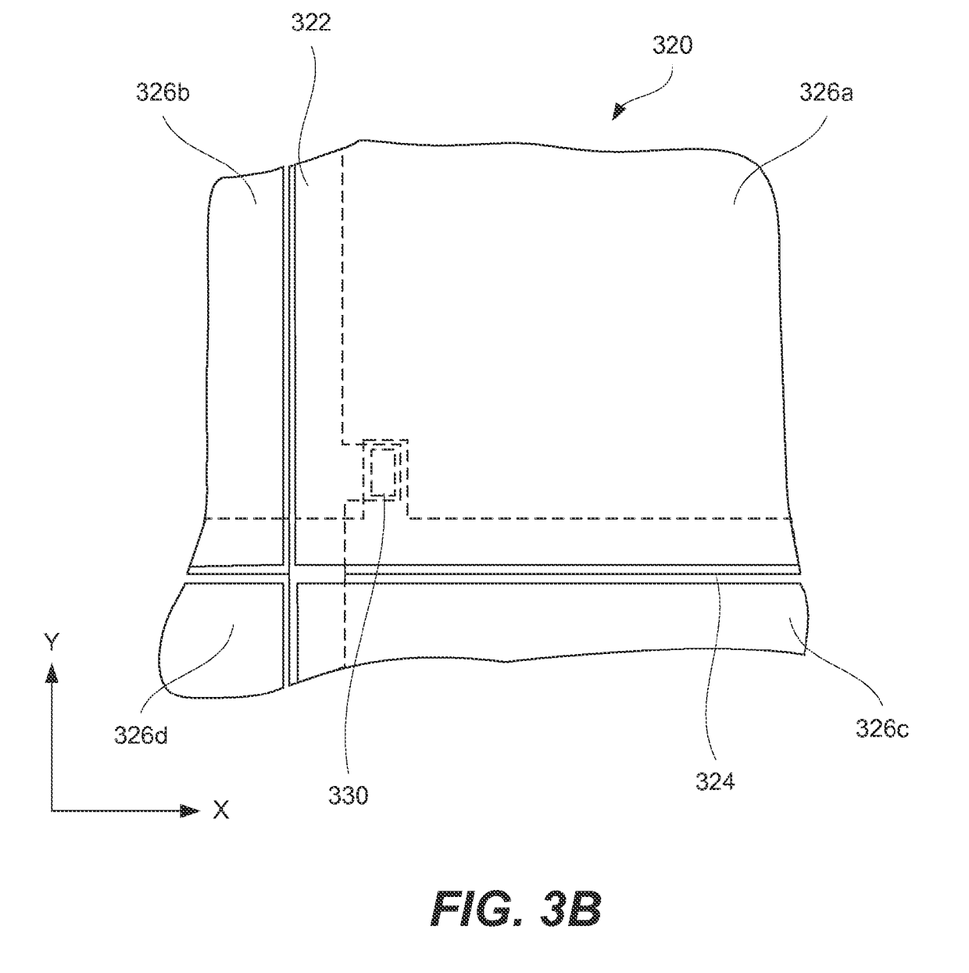
FIG. 3B is a schematic top view of a portion of a novel LCD device display that uses transparent resistive switching cells to control operation of LCD cells, in accordance with some embodiments.

FIG. 3B is a top schematic view of a portion of novel LCD device 320, in accordance with some embodiments. LCD device 320 uses resistive switching cell 330 (rather than a TFT) to control operation of LCD cell 326*a*. While various components of LCD device 320 and TFT-LCD device 300 (described above with reference to FIG. 3A) may be the same, LCD device 320 allows using other components, such as transparent electrodes/lines that are generally not suitable for TFT-LCD device 300. Furthermore, resistive switching cell 330 may be made transparent further expanding the light portion of LCD device 320 in comparison with TFT-LCD device 300.

LCD device 320 includes first electrode 322 and second electrode 324, which may be arranged orthogonally with respect to each other. First electrode 322 and second electrode 324 may be made from transparent materials as further described below with reference to FIG. 3C. As such, boundaries of first electrode 322 and second electrode 324 are partially show with dashed lines to illustrate that these electrodes do not block light from LCD cell 326*a* (as well as other cells 326*c*-326*d*) that partially extend under first electrode 322 and second electrode 324. Similar to gate line 302 and data line 304 described above, first electrode 322 and second electrode 324 may extend to edges of LCD device 320 and may be connected to external drive circuitry. LCD cell 326*a* extends under first electrode 322 and second electrode 324 and is connected to one of first electrode 322 and second electrode 324, in some embodiments, further described below with reference to FIG. 3D. Portions of three other LCD cells 326*b*-326*d* are shown for reference. Resistive switching cell 330 may be positioned near crossing of first electrode 322 and second electrode 324. First electrode 322 and second electrode 324 may be parts of resistive switching cell 330 as will now be described with reference to FIG. 3C. For reference, FIGS. 3B and 3C show Cartesian coordinates axes to reference orientation of resistive switching cell 330 in both figures.

Figure 3C:
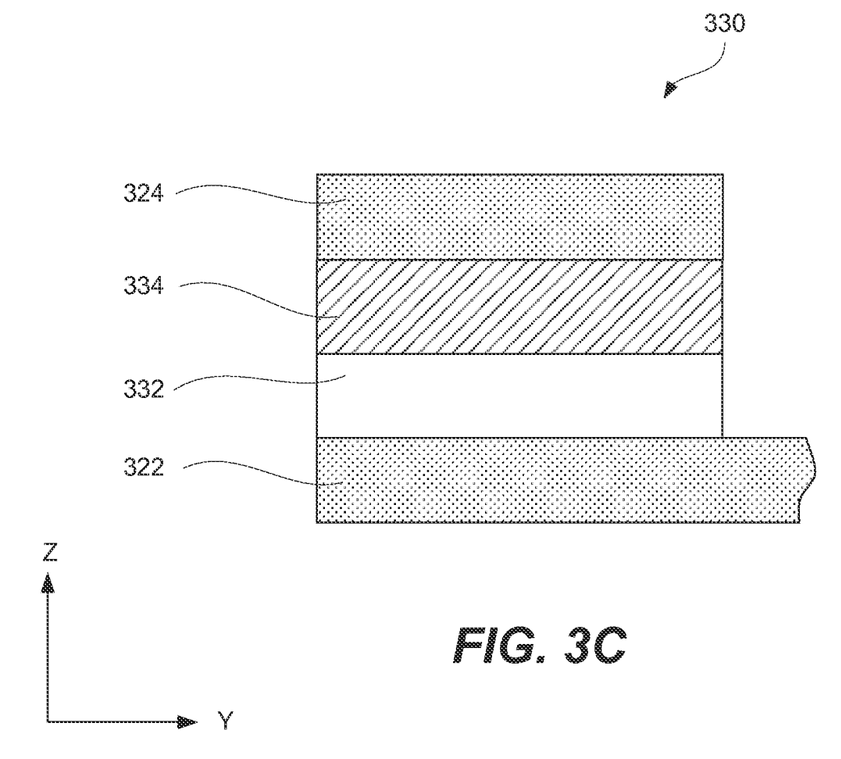
FIG. 3C is a schematic cross-sectional view of a transparent resistive switching cell, in accordance with some embodiments.

FIG. 3C illustrates a schematic cross-sectional representation of resistive switching cell 330 also shown in FIG. 3B, in accordance with some embodiments. Resistive switching cell 330 may be used to control operation of an LCD cell interconnected in series with resistive switching cell 330 or used for some other applications. As shown in FIG. 3C, resistive switching cell 330 may include first electrode 322, resistive switching layer 332, embedded resistor 334, and second electrode 324. The "first" and "second" terminology is used herein only for differentiating reasons and does not imply any deposition order or spatial orientation of the layers unless specifically noted. In some embodiments, resistive switching cell 330 has more or fewer layers. For example, an intermediate layer may be disposed between resistive switching layer 332 and embedded resistor 334 to prevent migration of materials between resistive switching layer 332 and embedded resistor 334. In some embodiments, an intermediate layer may be disposed between first electrode 322 and resistive switching layer 332 for form a particular interface with resistive switching layer 332. In this case, first electrode 322 may be referred to as a signal line, while the intermediate layer may be referred to as an electrode or, more specifically, an intermediate electrode. Furthermore, a current steering element may be disposed between first electrode 322 and second electrode 324. In some embodiments, embedded resistor 334 may be omitted from resistive switching cell 330.

Resistive switching layer 332 is disposed between first electrode 322 and second electrode 324. Resistive switching layer 332 is operable to switch between at least two different resistive states as, for example, described above with reference to FIGS. 1B-1C and 2A-2B. Resistive switching layer 306 can be fabricated from a dielectric material, such as a metal oxide, a metal nitride, or a metal oxynitride. Specifically, resistive switching layer 306 includes one of hafnium oxide, hafnium oxynitride, zirconium oxide, zirconium oxynitride, aluminum oxide, aluminum oxynitride, titanium oxide, titanium oxynitride, tantalum oxide, or tantalum oxynitride. In some embodiments, resistive switching layer 332 includes hafnium oxide or, more specifically, non-stoichiometric hafnium oxide, e.g., $HfO_X$ such that X is between about 1.7 and 1.9 or, more specifically, about 1.8. In some embodiments, resistive switching layer 332 also includes silicon oxide. This silicon oxide may forms a first sub-layer of resistive switching layer 306, while hafnium oxide may forms a second sub-layer of resistive switching layer 306 directly interfacing the first sub-layer.

Resistive switching layer 332 may have a thickness of less than 100 Angstroms. At this thickness, resistive switching layer 332 may be substantially transparent even if it formed from oxides and/or oxynitride that are not conventionally considered to be transparent. In some embodiments, resistive switching layer 332 has a thickness of less than 30 Angstroms, which further enhances transparency of resistive switching layer 306. Thinner resistive switching layers may be deposited using ALD, while thicker resistive switching layers may be deposited using may be deposited using ALD or physical vapor deposition (PVD) or, in some embodiments, chemical vapor deposition (CVD).

First electrode 322 may include a first transparent conductive oxide, while second electrode 324 may include a second transparent conductive oxide. In some embodiments, the first transparent conductive oxide of first electrode 322 is the same as the second transparent conductive oxide of second electrode 324 or, more specifically, the composition of the first electrode 322 may be the same as composition of second electrode 324. In some embodiments, at least one of the first transparent conductive oxide and the second transparent conductive oxide is one of indium oxide, indium tin oxide, or zinc oxide. More specifically, at least one of the first transparent conductive oxide and the second transparent conductive oxide includes zinc oxide doped with aluminum.

In some embodiments, both first and second transparent conductive oxides include zinc oxide doped with aluminum.

In some embodiments, resistive switching cell 330 also includes embedded resistor 334 disposed between resistive switching layer 332 and one of first electrode 322 and second electrode 334 as, for example, shown in FIG. 3C. Embedded resistor 334 may be operable to maintain a substantially constant resistance when resistive switching layer 306 switches between at least two different resistive states as described below with reference to FIGS. 1B-1C and 2A-2B. Embedded resistor 334 may have a thickness of less than 50 Angstroms or, more specifically, less than 30 Angstroms or even less than 20 Angstroms. In some embodiments, embedded resistor 334 includes one of tantalum silicon nitride, titanium silicon nitride, tungsten silicon nitride, or molybdenum silicon nitride. Specifically, embedded resistor 334 may include tantalum silicon nitride.

Figure 3D:
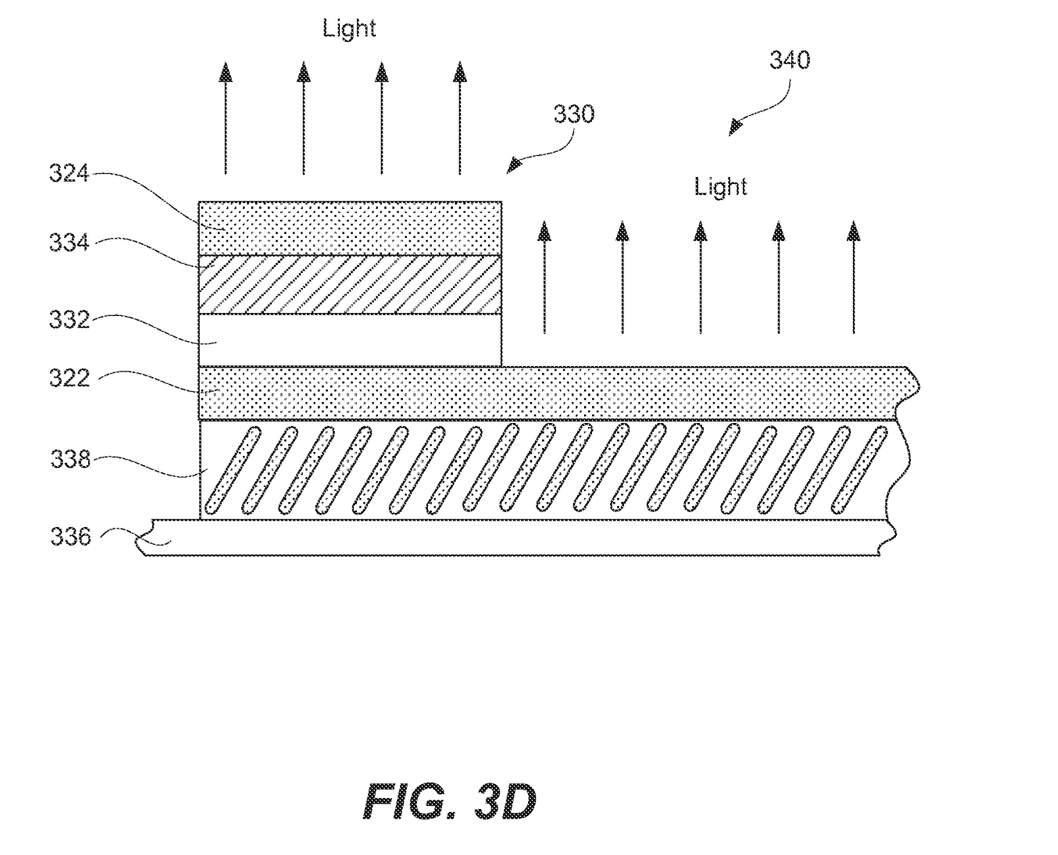
FIG. 3D is a schematic cross-sectional view of an assembly including a transparent resistive switching cell interconnected with an LCD cell, in accordance with some embodiments.

FIG. 3D illustrates assembly 340 including resistive switching cell 330 and LCD cell 338 disposed on the same substrate 336, in accordance with some embodiments. Substrate 336 may be a light guide or some other source of light that may be either permitted or blocked by LCD cell 338 depending on the operating potential applied to assembly 340 and resistive state of resistive switching cell 330 as further described below. It should be noted that resistive switching cell 330 may be transparent to light at all time. In some embodiments, optical transmittance of resistive switching cell 330 is at least about 80% or even at least about 90%. Selection of particular materials for components of resistive switching cell 330 and thickness of each component allows achieving this level of transmittance. Various examples of resistive switching cell 330 are described above with reference to FIG. 3C.

As shown in FIG. 3D, first electrode 332 of resistive switching cell 330 may extends past the primary boundary of resistive switching cell 330 defined by its resistive switching layer 332 and may form an electrical connection with LCD cell 338. In fact, first electrode 332 of resistive switching cell 330 may be also operable as a pixel electrode of LCD cell 338. Furthermore, first electrode 332 of resistive switching cell 330 may form connection with the external drive circuitry. This circuitry controls orientation of LC molecules in LCD cell 338 by controlling the resistive state of resistive switching layer 332 and applying the operating potential to second electrode 324. Specifically, the external drive circuitry may switch the resistive state of resistive switching layer 332 by applying switching pulses between first electrode 322 and second electrode. When resistive switching layer 332 is in the high resistive state and when the operating potential is applied to first electrode 322, LCD cell 338 only experiences a small portion of this operating potential and may not change orientation of its LC molecules. On the other hand, when resistive switching layer 332 is in its low resistive state and when the operating potential is applied to first electrode 322, LCD cell 338 experiences a much larger portion of this operating potential, which may change orientation of its LC molecules. This operation will not be further described below with reference to FIG. 4.

Operating Examples

Figure 4:
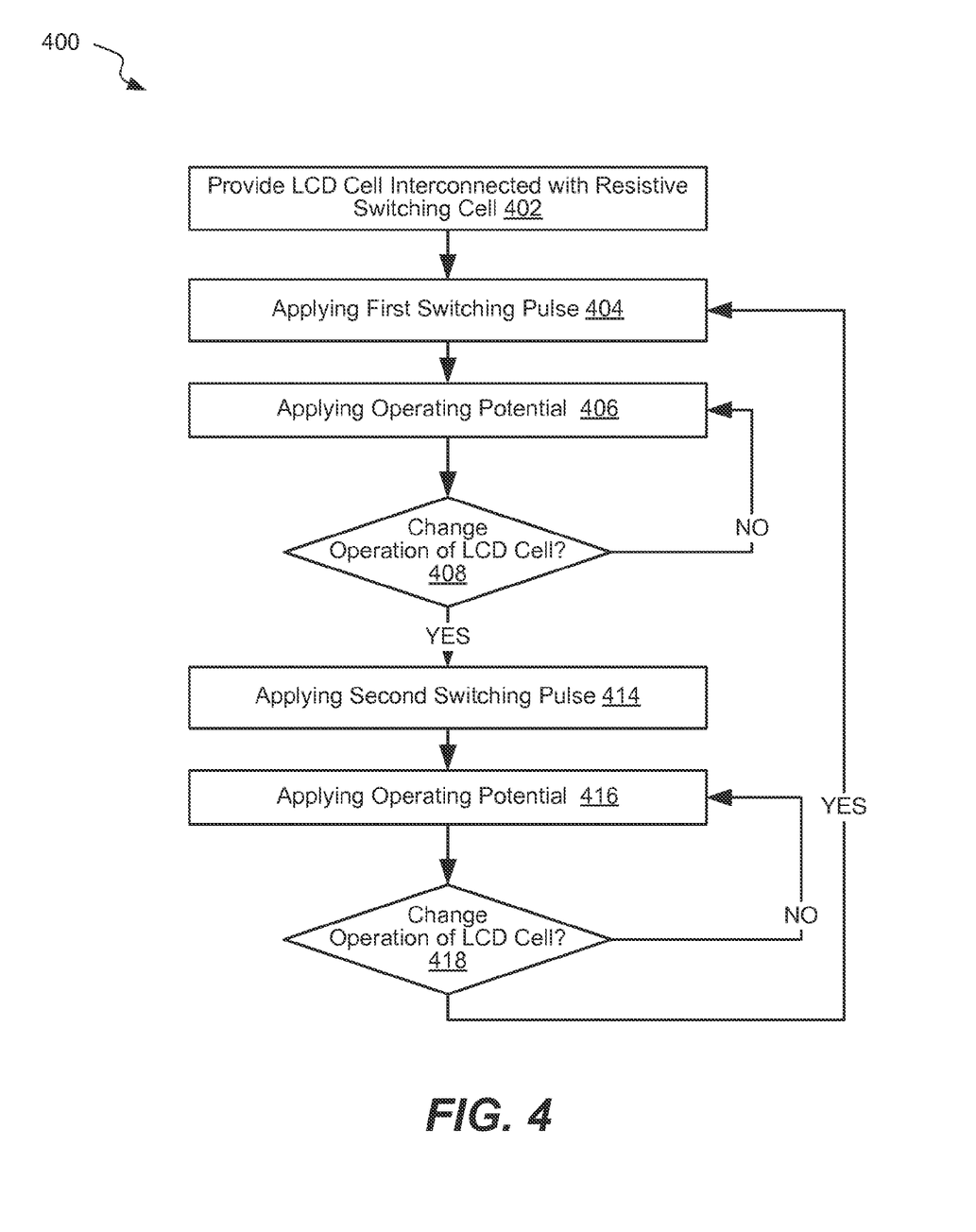
FIG. 4 illustrates a process flowchart corresponding to a method of operating a liquid crystal display uses a transparent resistive switching cell to control operation of an LCD cell, in accordance with some embodiments.

FIG. 4 illustrates a process flowchart corresponding to method 400 of operating an LCD device, in accordance with some embodiments. Method 400 may commence with providing an LCD cell interconnected in series with a resistive switching cell during operation 402. The resistive switching cell includes a first electrode disposed over a substrate, a resistive switching layer disposed over the first electrode such that the resistive switching layer is disposed between the first layer and the substrate. The resistive switching cell also includes a second layer disposed over the resistive switching layer such that the resistive switching layer is disposed between the first electrode and second electrode. The first electrode or the second electrode is connected to the LCD cell. The second electrode may be connected to a signal line used to monitor and switch the resistive state of the resistive switching layer. In some embodiments, the second electrode is operable as a signal line. Some examples of LCD cells interconnected in series with resistive switching cells are described above with reference to FIGS. 3B and 3D.

Method 400 may proceed with applying a first switching pulse between the two electrodes during operation 404. The resistive switching layer switches into the low resistance state when the first switching pulse is applied during operation 404. In some embodiments, the resistive switching layer may already be in the low resistance state and operation 404 is not performed. Various aspects of operation 404 are described above with reference to FIGS. 1B and 1C, in particular the transition from FIG. 1C to FIG. 1B. Specifically, operation 404 may involve one or more voltage pulses applied between the two electrodes. Prior to operation 404 and during operation 404 additional reading signals may be applied between the two electrodes to determine the resistive state of the resistive switching layer.

Method 400 may proceed with applying an operating potential to one of the electrodes of the resistive switching cell during operation 406. If the second electrode is connected to the LCD cell, then the operating potential is applied to the first electrode. Alternatively, if the first electrode is connected to the LCD cell, then the operating potential is applied to the second electrode. Because the resistive switching layer is in its low resistive state, the LCD cell will experience a large portion of this operating potential, which may cause reorientation of the LC molecules. In general, the LCD cell produces light while the operating potential is applied to one of the electrodes during operation 406 and while the resistive switching layer is in the low resistive state. At least a portion of the light produced by the LCD cell during this operation may be transmitted through the resistive switching cell.

In some embodiments, operation 406 may be repeated one or more times while the resistive switching layer remains in the low resistive state as indicated by decision block 408. In this case, the LCD cell continues producing the light while the operating potential is applied to one of the electrodes of the resistive switching cell. In some embodiments, operating conditions need to be changed, and method 400 may proceed with applying a second switching pulse between the electrodes during operation 414. The resistive switching layer switches into the high resistance state while applying the second switching pulse during this operation. Various aspects of operation 414 are described above with reference to FIGS. 1B and 1C, in particular the transition from FIG. 1C to FIG. 1B. For example, if the resistive switching cell is a bipolar cell, the potential applies to the electrodes during operation 414 has an opposite polarity that the potential applied to the electrodes during operation 404. In some embodiments, operation 414 also involves applying a reading pulse to confirm the resistive state of the resistive switching layer.

Method 400 may proceed with applying the operating potential to one of the electrodes during operation 416.

Operation 416 and operation 406 may be the same in some embodiments. However, because the resistive switching layer is its high resistive state during operation 416 (and in its low resistive state during operation 406), the LCD cell is subjected to a lower potential during operation 416 than, for example, during operation 406. As such, the LC molecules of the LCD cell may have a different orientation during operation 406 than during operation 416. In some embodiments, the LCD cell does not produce light during operation 416.

In some embodiments, operation 416 may be repeated one or more times while the resistive switching layer remains in the high resistive state as indicated by decision block 418. In this case, the LCD cell does not produce the light even though the operating potential is applied to one of the electrodes of the resistive switching cell. In some embodiments, operating conditions need to be changed, and method 400 may proceed with applying a first switching pulse between the electrodes during operation 404 as indicated by decision block 418.

Cell Array Examples

Figure 5:
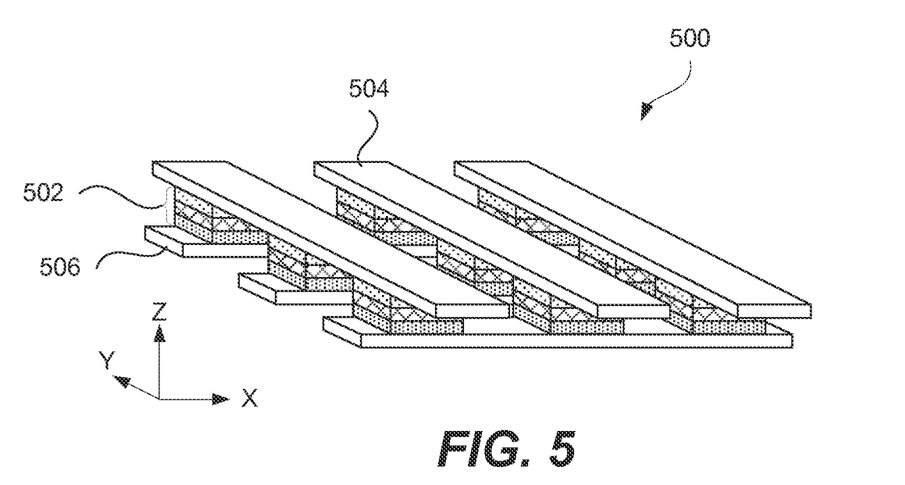
FIG. 5 is a schematic view of an array including multiple resistive switching cells, in accordance with some embodiments.

A brief description of arrays will now be described with reference to FIG. 5 to provide better understanding to various aspects of resistive switching cells described above. FIG. 5 illustrates array 500 including nine resistive switching cells 502, in accordance with some embodiments. In general, any number of resistive switching cells may be arranged into one array. Connections to each resistive switching cell 502 are provided by signal lines 504 and 506, which may be arranged orthogonally to each other. Resistive switching cells 502 are positioned at crossings of signal lines 504 and 506 that typically define boundaries of each resistive switching cell in array 500.

Signal lines 504 and 506 are sometimes referred to as word lines and bit lines. These lines are used to read and write data into each resistive switching cell 502 of array 500 by individually connecting resistive switching cells to read and write controllers. Individual resistive switching cells 502 or groups of resistive switching cells 502 can be addressed by using appropriate sets of signal lines 504 and 506. Each resistive switching cell 502 typically includes multiple layers, such as first and second electrodes, resistive switching layer, embedded resistors, embedded current steering elements, and the like, some of which are further described elsewhere in this document. In some embodiments, a resistive switching cell includes multiple resistive switching layers provided in between a crossing pair of signal lines 504 and 506.

As stated above, various read and write controllers may be used to control operations of resistive switching cells 502. A suitable controller is connected to resistive switching cells 502 by signal lines 504 and 506 and may be a part of the same device and circuitry. In some embodiments, a read and write controller is a separate device capable of controlling multiple devices each one containing an array of resistive switching cells. Any suitable read and write controller and array layout scheme may be used to construct a device from multiple resistive switching cells. In some embodiments, other electrical components may be associated with the overall array 500 or each resistive switching cell 502. For example, to avoid the parasitic-path-problem, i.e., signal bypasses by resistive switching cells in their low resistance state (LRS), serial elements with a particular non-linearity must be added at each node or, more specifically, into each element. Depending on the switching scheme of the resistive switching cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the device.

Conclusion

Although the foregoing examples have been described in some detail for purposes of clarity of understanding, the invention is not limited to the details provided. There are many alternative ways of implementing the invention. The disclosed examples are illustrative and not restrictive.

What is claimed:
1. An assembly comprising:
   a substrate;
   a liquid crystal display cell disposed over the substrate; and
   a resistive switching cell comprising a first layer, a second layer, and a third layer,
      wherein the first layer is disposed over the liquid crystal cell,
      wherein the second layer is disposed over the first layer such that the first layer is disposed between the second layer and the substrate; and
      wherein the third layer is disposed over the second layer such that the second layer is disposed between the first layer and the third layer,
      wherein the first layer and the third layer are operable as electrodes,
      wherein the first layer comprises a first transparent conductive oxide,
      wherein the third layer comprises a second transparent conductive oxide,
      wherein the second layer is operable to switch between at least two different resistive states,
      wherein the liquid crystal display set is connected in series with the resistive switching cell, and
      wherein the first layer, the second layer, and the third layer form a stack disposed over an illuminating surface of the liquid crystal display cell such that the liquid crystal display cell is disposed between the stack and the substrate.

2. The assembly of claim 1, wherein optical transmittance of the resistive switching cell is at least about 80% within the visible spectrum.

3. The assembly of claim 1, wherein the second layer comprises one of hafnium oxide, hafnium oxynitride, zirconium oxide, zirconium oxynitride, aluminum oxide, aluminum oxynitride, titanium oxide, titanium oxynitride, tantalum oxide, or tantalum oxynitride.

4. The assembly of claim 1, wherein the second layer comprises hafnium oxide.

5. The assembly of claim 4, wherein the hafnium oxide of the second layer is non-stoichiometric hafnium oxide.

6. The assembly of claim 4, wherein the second layer further comprises silicon oxide, wherein the silicon oxide forms a first sub-layer of the second layer, and wherein the hafnium oxide forms a second sub-layer of the second layer directly interfacing the first sub-layer.

7. The assembly of claim 1, wherein the second layer has a thickness of less than 30 Angstroms.

8. The assembly of claim 1, wherein at least one of the first transparent conductive oxide or the second transparent conductive oxide comprises one of indium oxide, indium tin oxide, or zinc oxide.

9. The assembly of claim 1, wherein at least one of the first transparent conductive oxide or the second transparent conductive oxide comprises zinc oxide doped with aluminum.

10. The assembly of claim 1, further comprising a fourth layer disposed between the second layer and one of the first layer or the third layer;
   wherein the fourth layer is operable to maintain a substantially constant resistance when the second layer switches between the at least two different resistive states; and
   wherein the fourth layer has a thickness of less than 50 Angstroms.

11. The assembly of claim 10, wherein the fourth layer comprises one of silicon nitride.

12. The assembly of claim 10, wherein the fourth layer comprises tantalum silicon nitride.

13. The assembly of claim 1, wherein operation of the liquid crystal display cell is based on the at least two different resistive states of the second layer.

14. The assembly of claim 1, wherein the liquid crystal display cell at least partially extend under the first layer and the second layer.

15. The assembly of claim 14, wherein the liquid crystal display cell directly interfaces the first layer.

16. The assembly of claim 15, wherein the second layer directly interfaces the first layer.

17. The assembly of claim 16, wherein the first electrode is a pixel electrode.

18. The assembly of claim 1, wherein the first electrode and the second electrode are connected to a driver circuit.

19. The assembly of claim 1, wherein the liquid crystal display is disposed between the substrate and the stack comprising the first layer, the second layer, and the third layer.

20. The assembly of claim 1, wherein the substrate is a light guide.

* * * * *